United States Patent
Palanduz et al.

(10) Patent No.: US 7,638,928 B2
(45) Date of Patent: Dec. 29, 2009

(54) PIEZO ACTUATOR FOR COOLING

(75) Inventors: Cengiz A. Palanduz, Chandler, AZ (US); Ioan Sauciuc, Phoenix, AZ (US); Reza Paydar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 483 days.

(21) Appl. No.: 11/173,903

(22) Filed: Jun. 30, 2005

(65) Prior Publication Data

US 2007/0001550 A1    Jan. 4, 2007

(51) Int. Cl.
*H01L 41/08* (2006.01)
(52) U.S. Cl. .................... 310/328; 310/311
(58) Field of Classification Search ............ 310/328, 310/311, 366, 330; 416/144; 417/410.2
See application file for complete search history.

(56) References Cited

U.S. PATENT DOCUMENTS

| | | | | |
|---|---|---|---|---|
| 4,595,338 A | * | 6/1986 | Kolm et al. | 310/330 |
| 4,780,062 A | * | 10/1988 | Yamada et al. | 417/410.2 |
| 5,419,682 A | | 5/1995 | Martin | |
| 5,861,703 A | * | 1/1999 | Losinski | 310/330 |
| 6,114,798 A | | 9/2000 | Maruyama et al. | |
| 7,061,161 B2 | * | 6/2006 | Scher et al. | 310/328 |

FOREIGN PATENT DOCUMENTS

| | | |
|---|---|---|
| JP | 2000-334381 | 12/2000 |
| JP | 2002-305331 | * 10/2002 |
| WO | WO-98/54765 A1 | 12/1998 |
| WO | WO-03/071132 A2 | 8/2003 |

OTHER PUBLICATIONS

"Partial International Search Report for corresponding PCT Application No. PCT/US2006/026107", (Oct. 25, 2006), 3 pgs.
Yorinaga, M., et al., "A Piezoelectric Fan Using PZT Ceramics", *Japanese Journal of Applied Physics*, vol. 24, Supplement 24-3, (1985), 203-205.
"International Search Report for corresponding PCT Application No. PCT/US2006/026107", (Feb. 6, 2007), 7 pgs.

* cited by examiner

*Primary Examiner*—Quyen Leung
*Assistant Examiner*—Karen B Addison
(74) *Attorney, Agent, or Firm*—Schwegman, Lundberg & Woessner, P.A.

(57) ABSTRACT

A piezo actuator includes a plurality of layers of ceramic material, a plurality of layers of conductive material interspersed between the plurality of layers of ceramic material, and a plate attached to an end of the actuator. The plate of the piezo actuator includes an overhang portion.

11 Claims, 8 Drawing Sheets

PIEZO ACTUATOR FOR COOLING

TECHNICAL FIELD

The inventive subject matter is related to a cooling (thermal) solution for microelectronic applications, especially, hand-held devices.

BACKGROUND INFORMATION

Currently available piezo fans are formed of piezoelectric material that includes lead, such as $PbZr_{1-x}Ti_xO_3$ (PZT). Use of lead in manufacturing situations presents problems, such as exposing workers to a hazardous material. In addition, the cost of manufacturing rises when specialized permits and increased regulations need to be met in order to manufacture a product. Furthermore, products that include a hazardous material, such as lead, are less likely to be accepted by consumers than a product that is free of hazardous materials. In addition, the use of a piezo fan that contains PZT piezoelectric material requires a high voltage for operation. In some instances, more than 100 volts are needed for operation. In addition, in a piezo fan that includes PZT, the fan blade is attached to the peizo actuator using an adhesive. These piezo fans have a low life time due to the poor adhesion between the fan blade and the piezo actuator. In addition, current piezo fans are relatively expensive.

BRIEF DESCRIPTION OF THE DRAWINGS

Embodiments of the invention are pointed out with particularity in the appended claims. However, a more complete understanding of the inventive subject matter may be derived by referring to the detailed description when considered in connection with the figures, wherein like reference numbers refer to similar items throughout the figures, and:

The description set out herein illustrates various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the inventive subject matter can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of the inventive subject matter. The following detailed description, therefore, is not to be taken in a limiting sense, and the scope of various embodiments of the invention is defined only by the appended claims, along with the full range of equivalents to which such claims are entitled.

Figure 1:
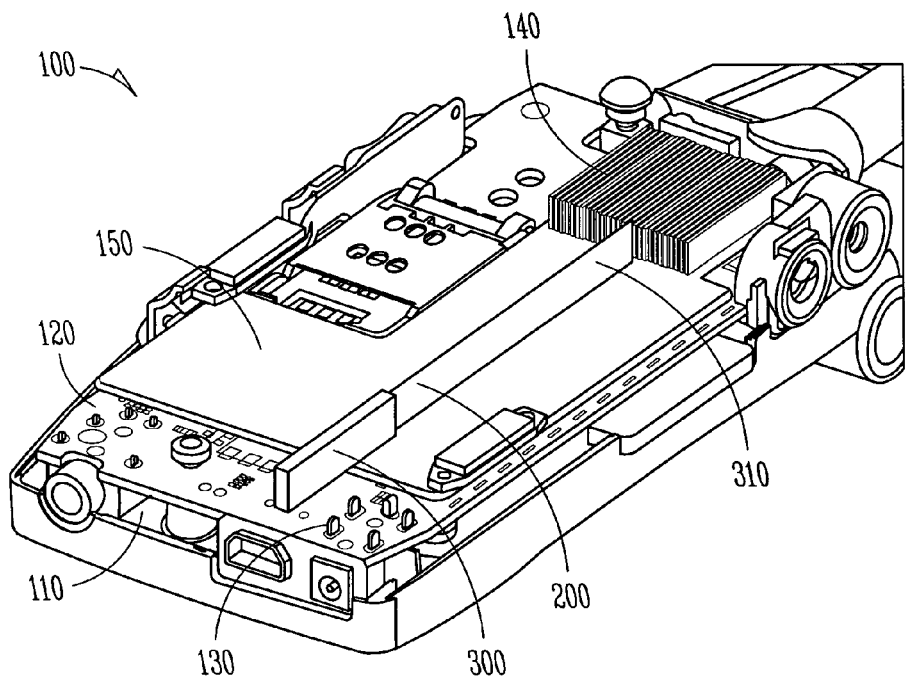
FIG. 1 is a perspective view of a piezo fan within an enclosure in a hand-held device, according to an example embodiment.

FIG. 1 is a perspective view of a piezo fan 200 within an enclosure 110 in a hand-held device 100, according to an example embodiment. As shown in FIG. 1, the hand-held device 100 is a cellular phone. It should be understood that the piezo fan 200 can be used to cool any type of device, including any type of hand-held device. A hand-held device includes a circuit board 120 which is populated with various electrical components 130. Placed near some of the electrical components (not shown) are a heat sink 140 and a heat pipe 150. The heat sink 140 and the heat pipe 150 transfer heat from electrical components. The piezo fan 200 includes a piezo actuator 300 and a fan blade 310. The piezo fan, and specifically the fan blade 310, are positioned within the enclosure 110 of the hand-held device 100 to generate air flow within the enclosure 110. The air flow allows for further cooling of the electrical components by convection or the movement of air over the electrical components, the heat sink 140 and the heat pipe 150.

Figure 2:
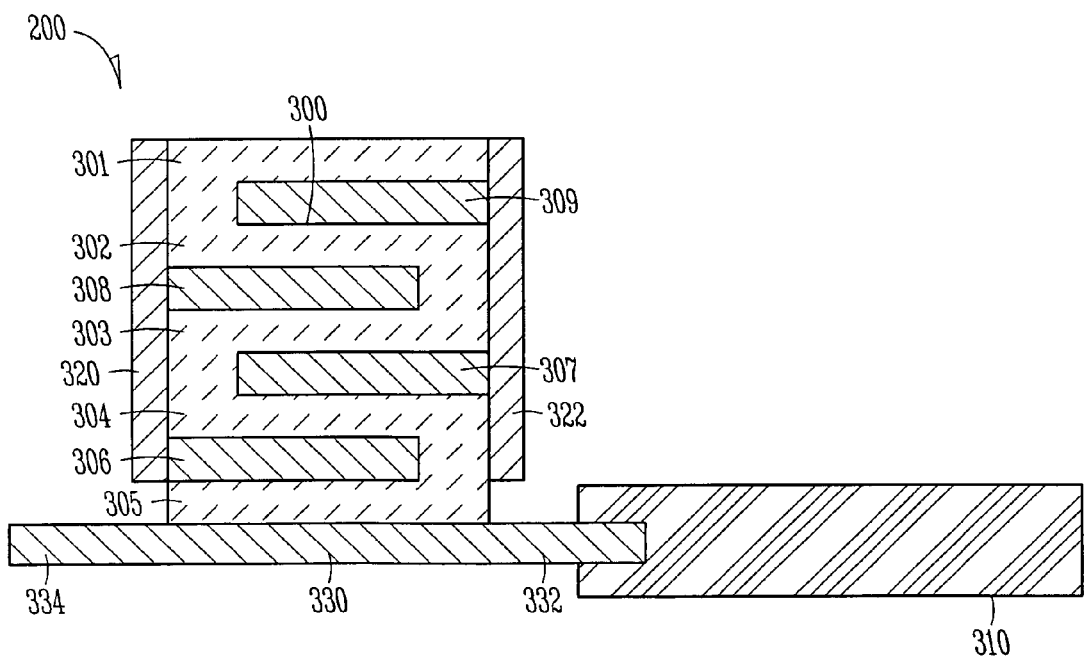
FIG. 2 is a schematic view of a piezo fan, according to an example embodiment.

FIG. 2 is a schematic view of a piezo fan 200, according to an example embodiment. The piezo fan 200 includes a piezo actuator 300 and a fan blade 310. The piezo actuator includes layers of piezoelectric ceramic material, such as layers 301, 302, 303, 304, 305. Interspersed between the layers of ceramic material 301, 302, 303, 304 are layers of nickel 306, 307, 308, 309. The piezo actuator 300 also includes a first electrode 320 and a second electrode 322. The first electrode 320 is attached to conductive material, such as nickel layers 306 and 308. The second electrode 322 is attached or electrically coupled to conductive layers 307 and 309. The layers of ceramic 301, 302, 303, 304, 305 are interspersed or between the layers of conductive material 306, 307, 308, 309.

Attached at one end of the piezo actuator is a plate or cap 330. The plate or cap 330 is made of the same conductive material as the conductive layers 306, 307, 308, 309. By applying an alternating current to the first electrode 320 and the second electrode 322, movement can be induced in the cap or plate 330 of the piezo actuator 300. Inducing movement in the plate or cap 330 also induces movement in the fan blade 310. Movement of the fan blade 310 causes air movement about the fan blade. In one embodiment of the invention, the ceramic material in the piezo actuator 300 is $BaTiO_3$. Also in one example embodiment, the conductive layer 306, 307, 308, 309, as well as the plate or cap 330, is made of nickel. The plate or cap 330 includes a first overhang 332 and a second overhang 334. The overhangs 332, 334 extend beyond the dimensions of the stack of conductive layers and ceramic layers or the laminated structure. Attached to the overhang 332 is the fan blade 310.

Figure 3:
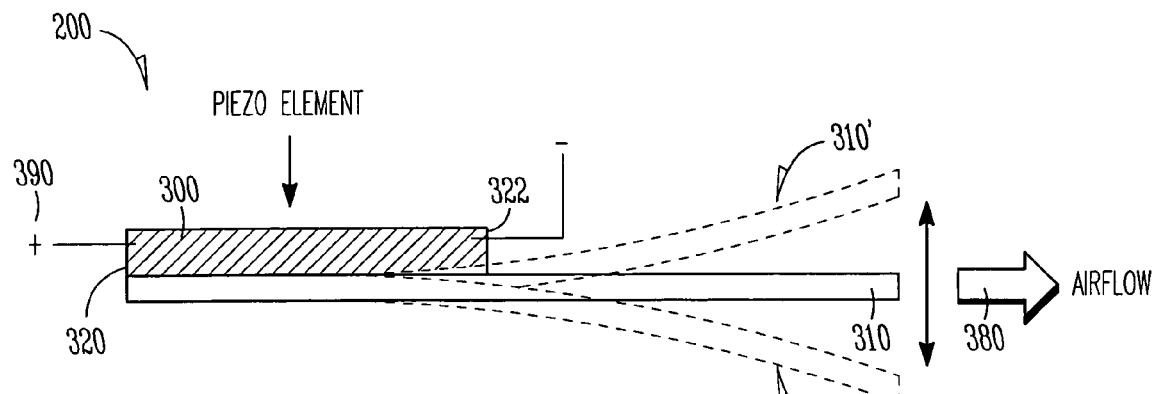
FIG. 3 is a top view of piezo fan electrically connected to a power source for operation, according to an example embodiment.

FIG. 3 is a top view of a piezo fan 200 directly connected to an AC power source 390 for operation, according to an example embodiment. The piezo fan 200 includes a piezo actuator 300 having a first electrode 320 and a second electrode 322. The piezo fan 200 also includes the fan blade 310. The electrode 320 and the second electrode 322 are connected to the AC power source 390 and the result is a motion of the fan blade 310 as depicted by dotted line positions of the fan blade at 310' and 310". Motion of the fan blade causes air flow, such as air flow depicted by the arrow carrying a reference number 380 in FIG. 3.

Figure 4:
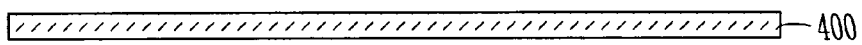
FIG. 4 illustrates a step in forming a piezo actuator, according to an example embodiment.
Figure 5:
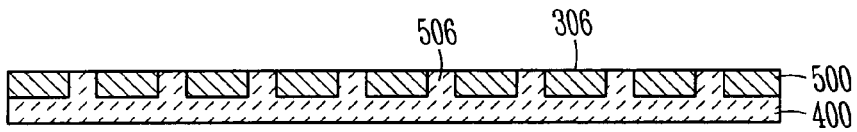
FIG. 5 illustrates a step in forming a piezo actuator, according to an example embodiment.
Figure 6:
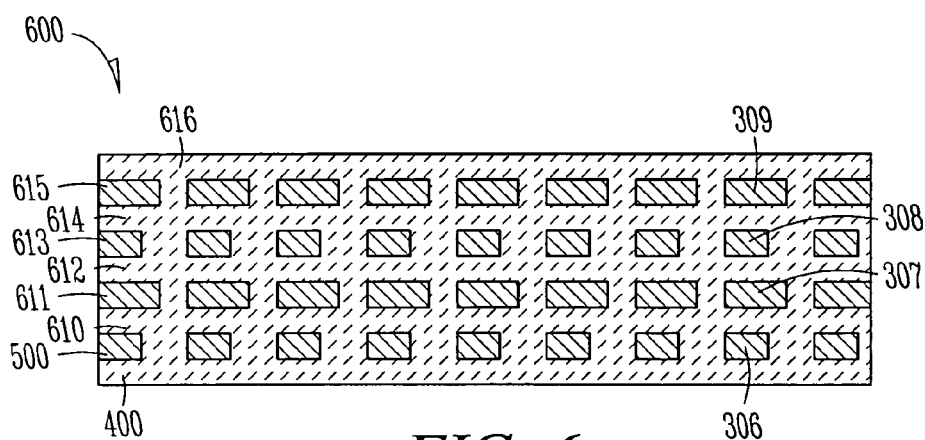
FIG. 6 illustrates a step in forming a piezo actuator, according to an example embodiment.

FIGS. 4 through 12 illustrate various steps in forming a piezo actuator 300 (shown in FIGS. 2 and 3), according to an example embodiment. FIGS. 4 through 6 show the process of forming a laminate or stack of ceramic layers and metal conductor layers. FIG. 4 depicts providing an initial layer of ceramic in the form of a green sheet. A green sheet is a layer of unfired ceramic, which is a mixture of ceramic power and organic binder material. In one embodiment of the invention, the ceramic material used is $BaTiO_3$, which is a lead-free material. The initial layer or green sheet of ceramic material carries the reference numeral 400.

FIG. 5 shows the addition of a layer 500 to the layer 400. The layer 500 includes a series of conductive metal portions such as conductive metal portion 306, which are formed by screen printing through a mask. The layer 500 is actually a layer of metal having various openings therein, such as opening 506. Each of the openings is filled with ceramic green material during the subsequent process step of green sheet lamination. When the metal paste and ceramic green sheet are co-heated or co-fired, a substantially solid body is formed.

FIG. 6 illustrates another step in forming the piezo actuator, according to an example embodiment. FIG. 6 shows that further layers are added to the stack to form a laminated structure 600 that includes layers 400 and 500 as well as additional layers 610, 611, 612, 613, 614, 615 and 616. The layers 610, 612, 614 and 616 are green sheet layers or ceramic layers. The layers 611, 613 and 615 are all layers that include metal conductors. Each of the layers 611, 613 and 615 are formed of metal paste having openings therein. The openings are provided with ceramic green during the lamination step. Upon co-firing the paste and the green sheet, the metal conductor and ceramic dielectric are fully formed. The result is a laminate structure 600. It should also be noted that the metal conductors in the various layers are laid out and dimensioned so that when the laminate or stack structure 600 is cut along selected cut lines, a piezo electric actuator can be formed. Also shown in FIG. 6 are the metal conductors 306, 307, 308, 309 which are positioned so that when the laminate or stack 600 is cut, eventually the conductors will form the same conductors as shown in FIG. 2.

Figure 7:
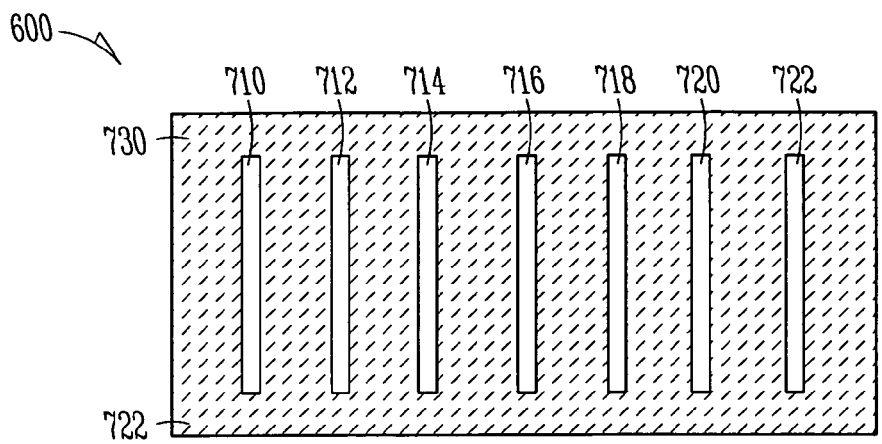
FIG. 7 illustrates a top view of the laminate structure, according to an example embodiment.

FIG. 7 shows a top view of the laminate structure 600, according to an example embodiment. The laminate structure 600 is cut to form slits or openings therein. The slits or openings carry the reference numbers 710, 712, 714, 716, 718, 720 and 722. The slits or openings 710, 712, 714, 716, 718, 720, 722 fall short of a first end 730 and a second end 732 of the laminate structure 600. The ends 730, 732 of the laminate structure 600 ensures that the portions remaining between the slits or openings 710, 712, 714, 716, 718, 720 and 722 remain in alignment.

Figure 8:
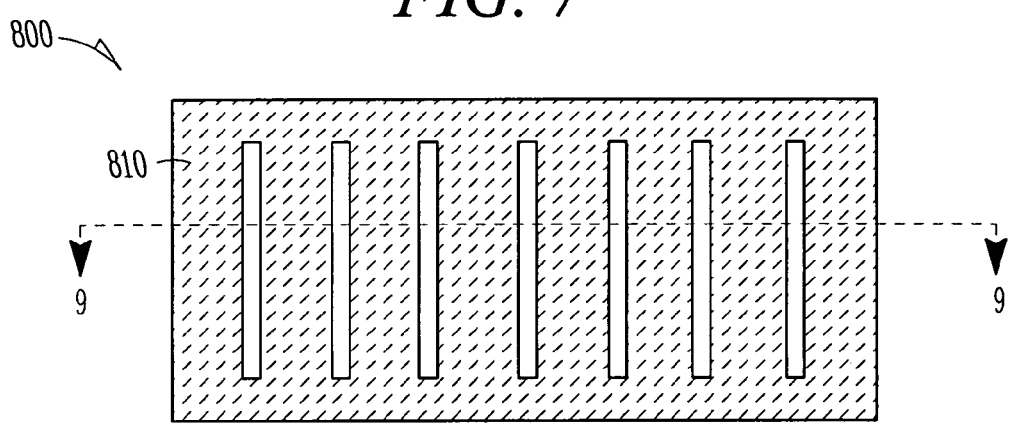
FIG. 8 illustrates a top view of the laminate structure after adding a metal conductive layer, according to an example embodiment.

FIG. 8 illustrates a top view of a laminate structure 800, according to an example embodiment. The laminate structure 600 with the slots or openings 710, 712, 714, 716, 718, 720, 722 is provided with an additional layer of metal 810. The metal layer 810 is a solid layer or a layer of metal green sheet which would be laminated on top of the underlying stack. Metal green sheet is formed of metal particles and organic binder material. The metal layer 810 is typically thicker than the layers such as layer 500, 611, 613, 615 (shown in FIG. 6).

Figure 9:
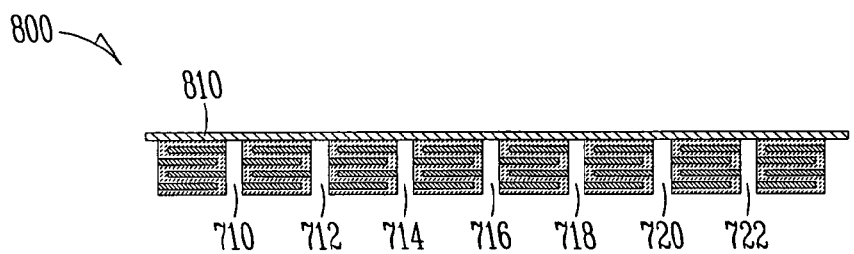
FIG. 9 illustrates a side view of the laminate structure of FIG. 8 along line 9-9, according to an example embodiment.

FIG. 9 illustrates a side view of the laminate structure 800 of FIG. 8 along line 9-9, according to an example embodiment. FIG. 9 shows the additional metal layer 810 placed atop the openings or slots 710, 712, 714, 716, 718, 720 and 722.

Figure 10:
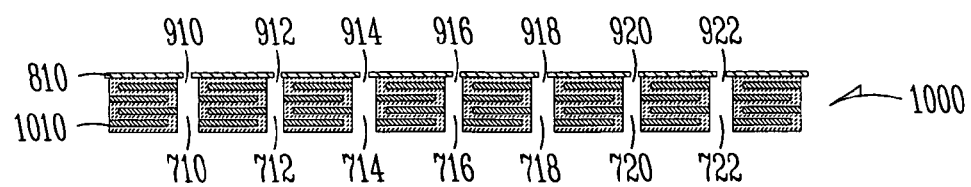
FIG. 10 illustrates a step in forming a fan blade on the piezo actuator, according to an example embodiment.

FIG. 10 illustrates a laminate structure 1000. The laminate structure 1000 differs from the laminate structure 800 only in that openings 910, 912, 914, 916, 918, 920 and 922 are made in the metal layer 810 of the laminate structure. It should be noted that openings 910, 912, 914, 916, 918, 920, 922 have a width that is less than the corresponding opening 710, 712, 714, 716, 718, 720, 722. The openings 910, 912, 914, 916, 918, 920, 922 are also slots that have the same lengths as the slots or openings 710, 712, 714, 716, 718, 720, 722. The openings 910, 912, 914, 916, 918, 920, 922 and the openings 710, 712, 714, 716, 718, 720, 722 can be formed by mechanical punching or laser ($CO_2$ laser is typically used for such operations—laser burns the organic binder and the metal+ceramic powder just gets sputtered away or falls down through the openings) punching. The openings 910, 912, 914, 916, 918, 920 and 922 have a width that is less than the corresponding openings 710, 712, 714, 716, 718, 720, 722. The laminate structure 1000 can then be diced to form individual structures that eventually become a piezo actuator. The rows between the openings 710, 712, 714, 716, 718, 720, 722 in the laminate structure 1000 can then be diced to form individual actuator portions. The individual actuator portions will have a cross section similar to the cross section shown in row 1010 shown in FIG. 10. The narrower slots or openings 910, 912, 914, 916, 918, 920 and 922 provide for an overhang or cap structure or plate structure, such as plate 330 (shown in FIG. 3) on the individual actuator portions.

Figure 11:
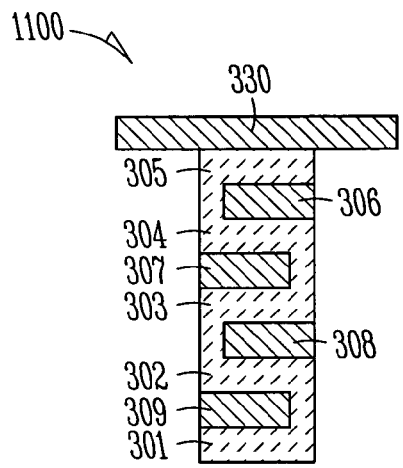
FIG. 11 shows a side view of an individual actuator portion, according to an example embodiment.

FIG. 11 shows a side view of an individual actuator portion 1100, according to an example embodiment. The individual 1100, actuator portion includes the cap 330 as well as the ceramic layers 301, 302, 303, 304, 305 and the metal-containing layers 306, 307, 308, 309. At this point in the process, the individual actuator portion 1100 is sintered. The sintering takes place in a reducing atmosphere. If the atmosphere is too reducing, then the ceramic ($BaTiO_3$) will be electrically conducting or leaky. Sintering also bonds the nickel and the ceramic. Therefore, sintering also bonds the plate or cap 330 to the layer 305 of ceramic of the individual actuator portion 1100.

Figure 12:
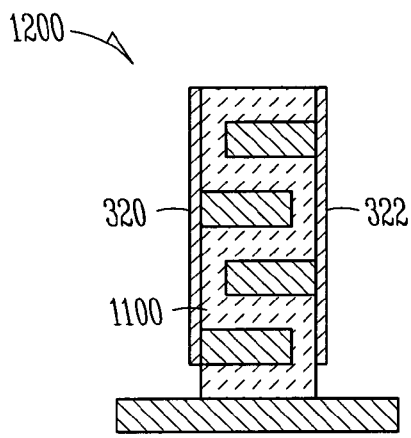
FIG. 12 illustrates a step in forming a piezo actuator, according to an example embodiment.

FIG. 12 shows the individual actuator portion 1100 after side metal paste has been applied to the side of the individual actuator portion 1100. The side metal paste forms the electrode 320 and the electrode 322. The side metal paste can be placed on the individual actuator portion 1100 in many ways, including placing conductive ink on the sides of the individual actuator portion. After the side metal paste is applied, the structure shown in FIG. 12 is further annealed. The structure in FIG. 12 now carries the reference numeral 1200.

Figure 13:
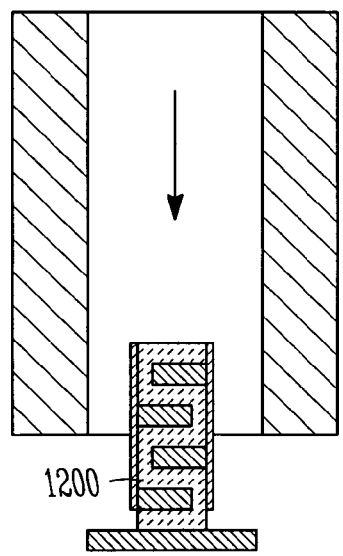
FIG. 13 illustrates a step in forming a piezo actuator, according to an example embodiment.

FIG. 13 illustrates another step in forming a piezo actuator, according to an example embodiment. FIG. 13 shows that the individual actuator portions 1200 are then poled by applying heat and a DC electric field in order to align the ferro electric domain in a direction normal to the metal conductive portion or planes of the metal conduction portions, such as the planes defined by conductive metal portions 306, 307, 308, 309 (as shown in FIG. 11). This is referred to as poling the individual actuator portions. This converts the structure 1200 (shown in FIG. 12) from a capacitor into a piezo electric element or actuator. Once the structure 1200 is poled by applying the heat and DC electric field, thereby properly aligning the ferro electric domains, the structure 1200 is now equivalent to a piezo actuator 300 (shown in FIGS. 2 and 3). To complete the piezo fan, a fan blade is attached to the plate or cap 330 (shown in FIGS. 2 and 11).

Figure 14:
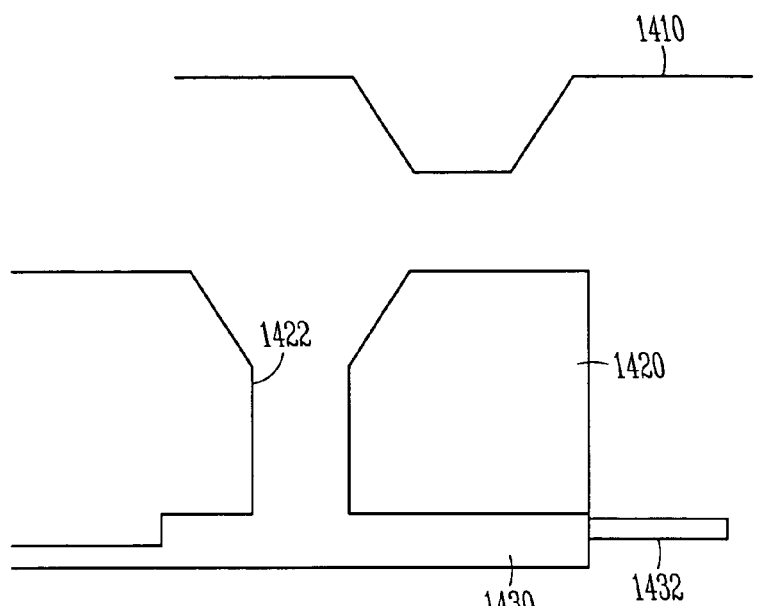
FIG. 14 illustrates a mold for forming a fan blade on the piezo actuator, according to an example embodiment.

FIG. 14 illustrates a mold for a fan blade for the piezo actuator 300. The mold 1400 includes a top portion 1410 and a bottom portion 1420. The bottom portion 1420 includes an opening for receiving the piezo actuator 300. The opening for receiving the piezo actuator 300 carries the reference numeral 1422. The bottom portion 1420 of the mold 1400 also includes a recess or opening 1430 in the shape of a fan blade. A runner 1432 is in fluid communication with the opening 1430.

Figure 15:
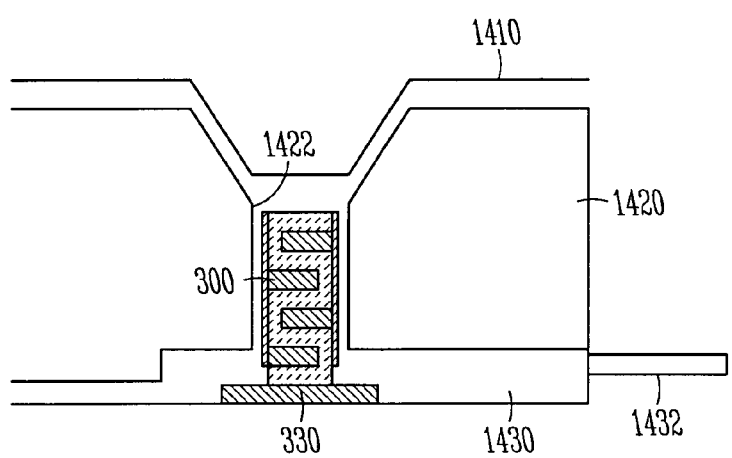
FIG. 15 illustrates a step in forming a fan blade on the piezo actuator, according to an example embodiment.

FIG. 15 illustrates a step in the forming of the fan blade of the piezo actuator 300, according to an example embodiment. The piezo actuator 300 is placed into the mold with the cap or plate 330 extending into the opening 1430 in the bottom 1420 of the mold 1400. The top part of the mold 1410 is placed on top of the bottom portion of the mold 1420.

Figure 16:
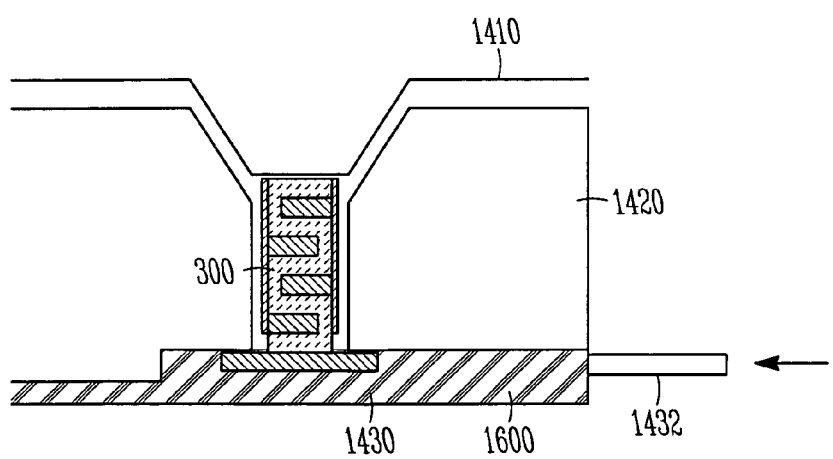
FIG. 16 illustrates a step in forming a fan blade on the piezo actuator, according to an example embodiment.

FIG. 16 illustrates another step in forming the fan blade on the piezo actuator 300. As shown in FIG. 16, a moldable material, such as moldable plastic is injected via the runner 1432 in to the opening 1430. The plastic moldable material 1600 is then allowed to cure and the resultant piezo electric fan 200 is removed from the mold.

Figure 17:
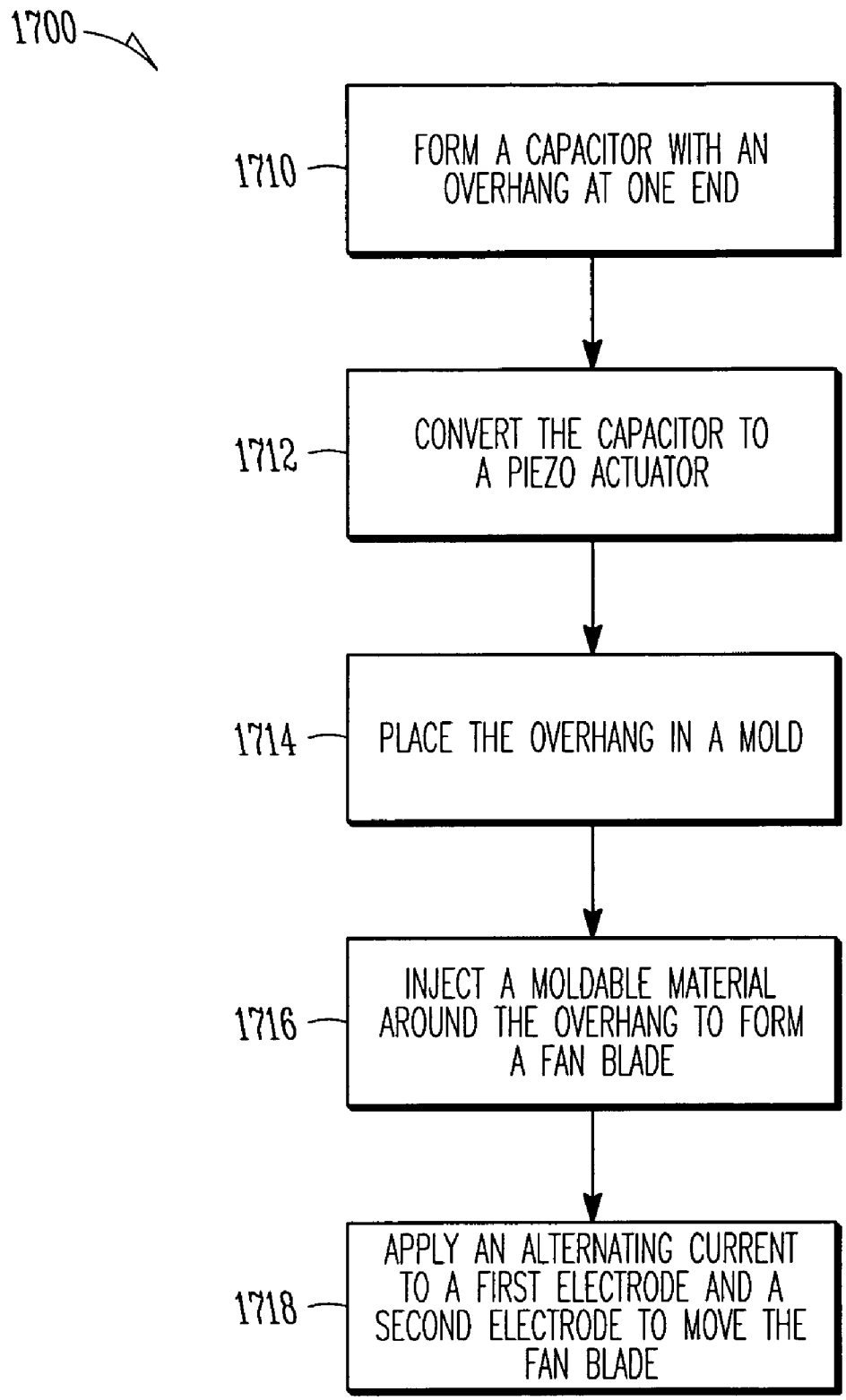
FIG. 17 is a flow diagram for forming a piezo fan, according to an example embodiment.

FIG. 17 is a flow diagram for forming a piezo fan, according to an example embodiment. FIG. 17 is basically an overview of the manufacturing process just described. A method 1700 includes forming a capacitor with an overhang at one end 1710, converting the capacitor to a piezo actuator 1712, and placing the overhang in a mold 1714, and injecting a moldable material around the overhang to form a fan blade 1716. In one embodiment, converting the capacitor to a piezo actuator 1712 includes poling the capacitor by applying heat and a dc electric field to align the ferroelectric domains in a direction substantially normal to the capacitive planes. In one embodiment, forming a capacitor with an overhang 1710 at one end includes sintering an assembly including layers of conductive material. The layers of ceramic material are interposed between the layers of conductive material and the overhang. The method 1700 also includes applying an alternating current to a first electrode and a second electrode to move the fan blade 1718.

Figure 18A:
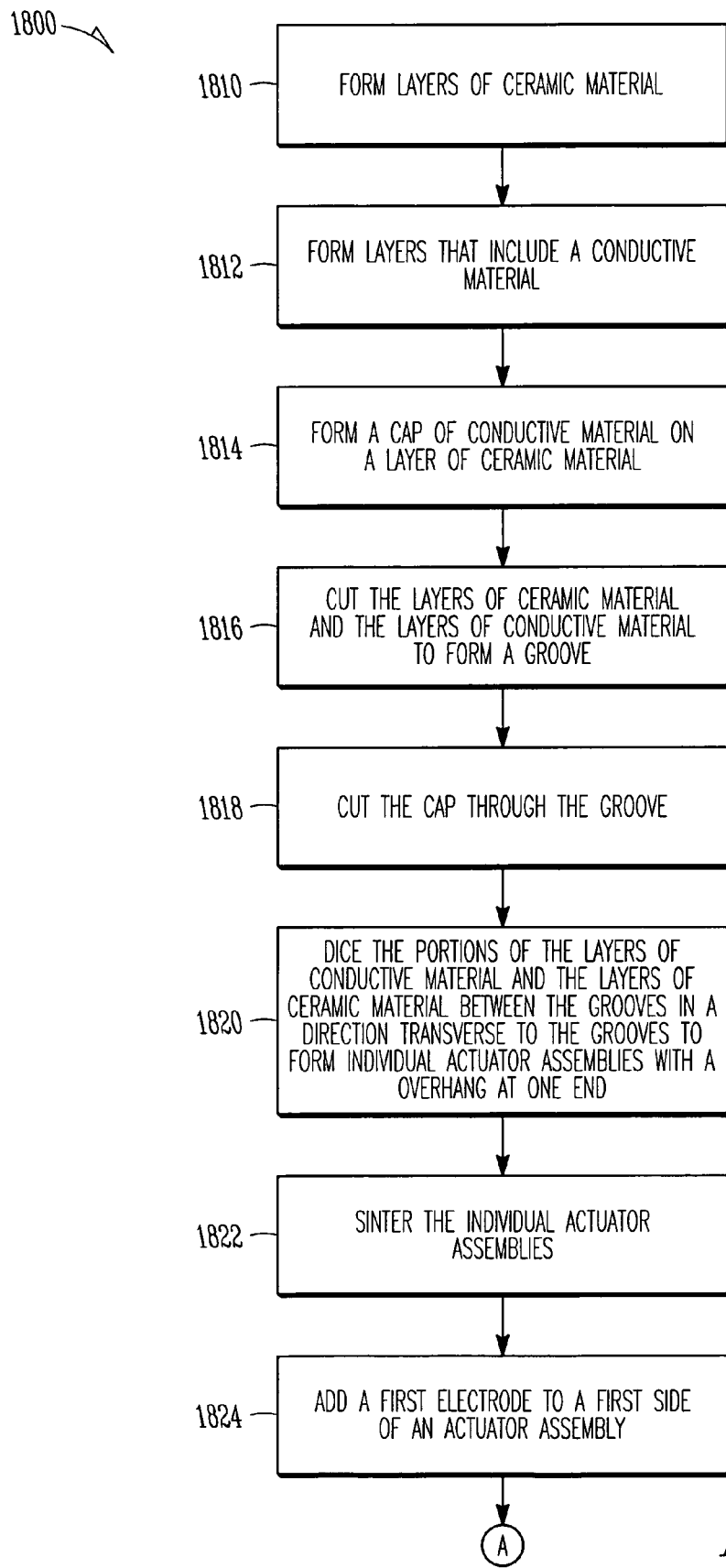
FIGS. 18A and 18B are a flow diagram for forming a piezo fan, according to an example embodiment.
Figure 18B:
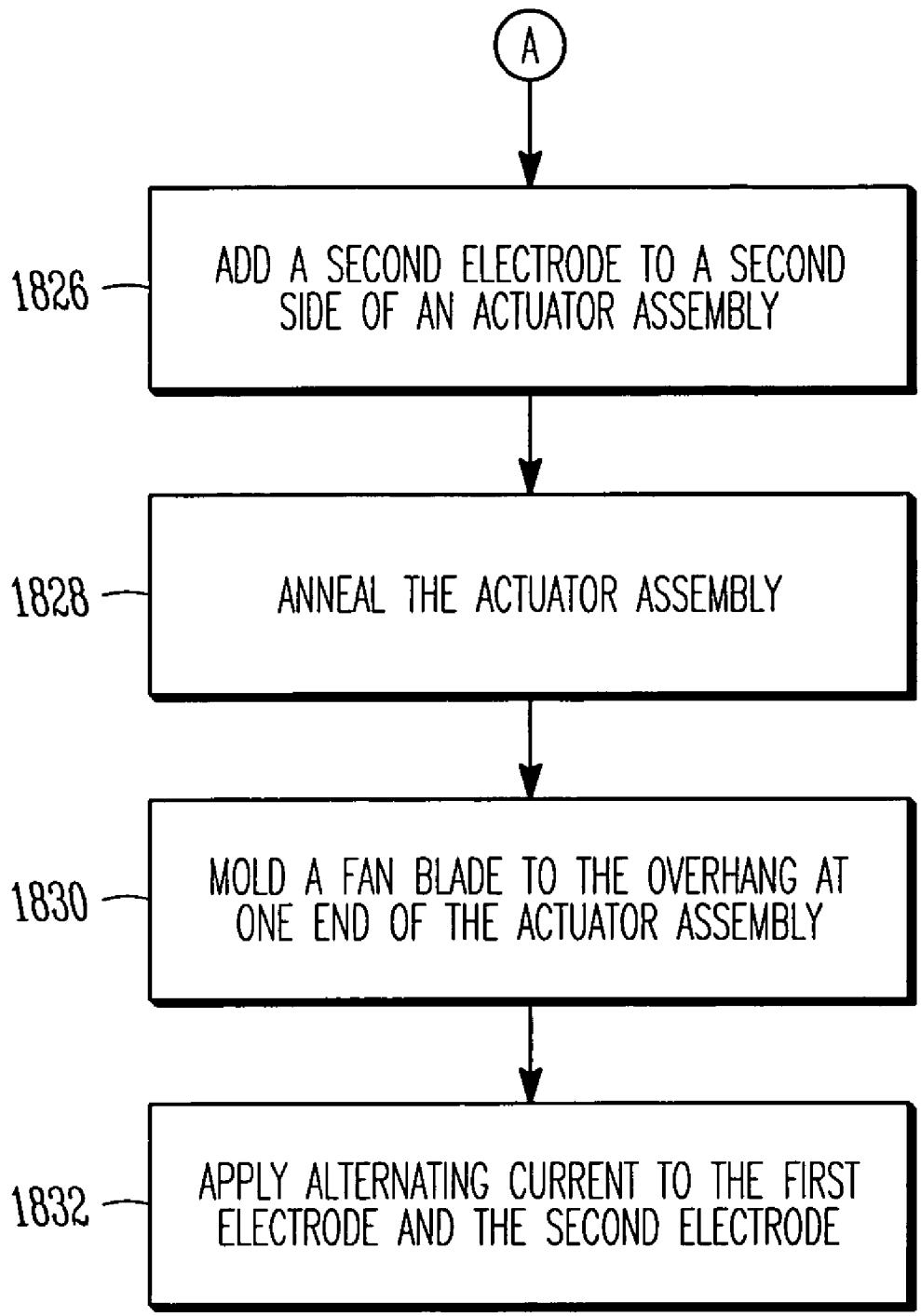

FIGS. 18A and 18B are a flow diagram of a method 1800 for forming a piezo fan, according to an example embodiment. The method 1800 includes forming layers of ceramic material 1810, and forming layers that include a conductive material 1812, the layers including a conductive material alternated with the layers of ceramic material. The method 1800 also includes forming a cap of conductive material on a layer of ceramic material 1814. The layers of ceramic material and the layers of conductive material are cut or grooved 1816. The cut has a first width. The cap is cut through the groove 1818 formed by cutting the layers of ceramic material and the layers of conductive material. The second cut has a second width less than the first width. Portions of the cap overhang the layers of ceramic material and the layers of conductive material. The method 1800 also includes dicing the portions of the layers of conductive material and the layers of ceramic material between the grooves 1820 in a direction transverse to the grooves to form individual actuator assemblies with a overhang at one end. The method 1800 includes sintering the individual actuator assemblies 1822, adding a first electrode to a first side of an actuator assembly 1824, adding a second electrode to a second side of an actuator assembly 1826, and annealing the actuator assembly 1828. The method 1800 also includes molding a fan blade to the overhang 1830 at one end of the actuator assembly. In one embodiment, the fan blade is molded by injecting a mold material around the overhang at one end of the actuator assembly to form a fan blade. The method 1800 includes applying alternating current to the first electrode and the second electrode 1832.

Turning to FIGS. 1 and 2, a system includes a device 100 (shown in FIG. 1) having an enclosure 110, and a fan 200 including a piezo actuator 300. The piezo actuator 300 includes a plurality of layers of ceramic material 301, 302, 303, 304, 305, a plurality of layers of conductive material 306, 307, 308, 309 interspersed between the plurality of layers of ceramic material, and a plate 330 attached to an end of the actuator. The system also includes a fan blade 310 attached to the plate 330 of the piezo actuator 300. In some embodiments, the fan blade 310 is injection molded around the plate 330 of the piezo actuator. The system further includes a fan blade 310 attached to the plate 330 of the piezo actuator 300, a first electrode 320 attached to a first set of the plurality of conductive material, a second electrode 322 attached to a second set of the plurality of layers of conductive material, and a source of alternating current attached to the first electrode and the second electrode. The fan 200 is positioned within the enclosure 110 of the device 100 to move air over a portion of the device and cool the portion of the device by convection. In some embodiments, the alternating current applied to the piezo fan causes the fan blade 310 to vibrate at a resonant frequency.

A piezo actuator includes a plurality of layers of ceramic material, a plurality of layers of conductive material interspersed between the plurality of layers of ceramic material, and a plate attached to an end of the actuator. The plate of the piezo actuator includes an overhang portion attached to a layer of ceramic material. In one embodiment, the plate is attached to a layer of ceramic material by sintering the plurality of layers of $BaTiO_3$, the plurality of layers of conductive material, and the plate. The plate is formed of substantially the same material as the plurality of layers of conductive material. The piezo actuator further includes a blade attached to the plate. In one embodiment, the blade is injection molded around the plate. The piezo actuator also includes a source of current electrically attached to the piezo actuator. In one embodiment, the source of current is a source of alternating current. The piezo actuator also includes a first electrode attached to a first set of layers of ceramic material, and a second electrode attached to a second set of layers of ceramic material. The source of alternating current is electrically attached to the first electrode and the second electrode. In some embodiments, the plurality of layers of ceramic material and the plurality of layers of conductive material have a thickness in the range of 1 micron to 4 microns. In some embodiments, the layers of ceramic material are $BaTiO_3$.

The foregoing description of the specific embodiments reveals the general nature of the inventive subject matter sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the embodiments of the invention are intended to embrace all such alternatives, modifications, equivalents and variations as fall within the spirit and broad scope of the appended claims.

What is claimed is:

1. A piezo actuator comprising:
   a plurality of layers of piezoelectric material, the piezoelectric material including $BaTiO_3$;
   a plurality of layers of conductive material interspersed between the plurality of layers of piezoelectric material;
   a plate attached to an end of the actuator; and
   a plastic blade attached to the plate.

2. The piezo actuator of claim 1 wherein the plate includes an overhang portion.

3. The piezo actuator of claim 1 wherein the plate is attached to the piezoelectric material.

4. The piezo actuator of claim 1 wherein the plate is formed of substantially the same material as the plurality of layers of conductive material.

5. The piezo actuator of claim 1 wherein the plurality of layers of piezoelectric material and the plurality of layers of conductive material are located on only one side of the plate.

6. A piezo actuator comprising:
   a plurality of layers of piezoelectric material, the piezoelectric material including $BaTiO_3$;
   a plurality of layers of conductive material interspersed between the plurality of layers of piezoelectric material;
   a plate attached to an end of the actuator; and
   a blade injection molded around the plate.

7. The piezo actuator of claim 6 further comprising:
   a first electrode attached to a first set of layers of the plurality of layers of piezoelectric material;
   a second electrode attached to a second set of layers of the plurality of layers of piezoelectric material; and
   a source of alternating current electrically attached to the first electrode and the second electrode.

8. A system comprising:
   a device having an enclosure; and
   a fan including a piezo actuator, the piezo actuator comprising:
      a plurality of layers of $BaTiO_3$ material;
      a plurality of layers of conductive material interspersed between the plurality of layers of $BaTiO_3$ material;
      a plate attached to an end of the actuator; and
      a fan blade injection molded around the plate of the piezo actuator.

9. The system of claim 8 further comprising:
   a first electrode attached to a first set of the plurality of conductive material;
   a second electrode attached to a second set of the plurality of layers of conductive material; and
   a source of alternating current attached to the first electrode and the second electrode.

10. The system of claim 9 wherein the fan is positioned within the enclosure of the device to move air over a portion of the device and cool the portion of the device by convection.

11. The system of claim 9 wherein the fan blade is to vibrate at a resonant frequency in response to the source of alternating current.

* * * * *

UNITED STATES PATENT AND TRADEMARK OFFICE
CERTIFICATE OF CORRECTION

PATENT NO. : 7,638,928 B2
APPLICATION NO. : 11/173903
DATED : December 29, 2009
INVENTOR(S) : Palanduz et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 980 days.

Signed and Sealed this

Twenty-first Day of December, 2010

David J. Kappos
*Director of the United States Patent and Trademark Office*